(12) United States Patent
Tsorng et al.

(10) Patent No.: US 12,111,121 B2
(45) Date of Patent: Oct. 8, 2024

(54) DIE-CAST FIN WITH OPENING AND COVER

(71) Applicant: Quanta Computer Inc., Taoyuan (TW)

(72) Inventors: Yaw-Tzorng Tsorng, Taoyuan (TW); Jen-Jia Liou, Taoyuan (TW); Chun-Chen Hsu, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 349 days.

(21) Appl. No.: 17/576,863

(22) Filed: Jan. 14, 2022

(65) Prior Publication Data
US 2023/0152046 A1 May 18, 2023

Related U.S. Application Data

(60) Provisional application No. 63/264,282, filed on Nov. 18, 2021.

(51) Int. Cl.
*H05K 7/20* (2006.01)
*F28F 3/04* (2006.01)
*G06F 1/20* (2006.01)

(52) U.S. Cl.
CPC .......... *F28F 3/04* (2013.01); *G06F 1/20* (2013.01); *H05K 7/2039* (2013.01)

(58) Field of Classification Search
CPC .......... F28F 3/04; F28F 2255/14; G06F 1/20; H05K 7/2039; F28D 2021/0029
See application file for complete search history.

(56) References Cited

U.S. PATENT DOCUMENTS

| | | | | |
|---|---|---|---|---|
| 5,453,911 A | * | 9/1995 | Wolgemuth | H05K 7/20927 361/689 |
| 6,874,566 B1 | * | 4/2005 | Artman | H01L 23/467 257/E23.099 |
| 8,537,540 B2 | * | 9/2013 | Landon | G06F 1/183 361/679.54 |
| 9,678,546 B2 | * | 6/2017 | May | H05K 7/20409 |
| 10,003,153 B1 | * | 6/2018 | Lai | H01R 13/516 |
| 10,470,321 B1 | * | 11/2019 | Davis | H05K 7/20409 |

(Continued)

FOREIGN PATENT DOCUMENTS

KR 20080062109 A * 7/2008 ............ G06K 19/07

OTHER PUBLICATIONS

Lee Ji Young, "Socket Assembly for Circuit Module Card", Jul. 3, 2008, LG Electronics Inc., Entire Document (Translation of KR 20080062109). (Year: 2008).*

*Primary Examiner* — Stephen S Sul
(74) *Attorney, Agent, or Firm* — NIXON PEABODY LLP

(57) ABSTRACT

A die-cast cooling device for protecting a computer assembly is disclosed. The die-cast cooling device includes a cooling plate, a plurality of die-cast fins, an opening formed on the cooling plate, and a cover coupled to the cooling plate. The cooling plate extends between two side walls, and the cooling plate and the side walls are arranged to form a protective space for computing components. The plurality of die-cast fins are formed on the cooling plate, extending away from the protective space. The opening provides access to the protective space. The cover is movable between a closed position and an open position, the cover preventing access to the protective space in the closed position, and the cover providing access to the protective space in the open position.

19 Claims, 6 Drawing Sheets

(56) References Cited

U.S. PATENT DOCUMENTS

| | | | | |
|---|---|---|---|---|
| 2002/0089825 | A1* | 7/2002 | Sasaki | G06F 1/20 |
| | | | | 361/702 |
| 2002/0185270 | A1* | 12/2002 | McCullough | H01L 23/4093 |
| | | | | 165/905 |
| 2004/0177947 | A1* | 9/2004 | Krassowski | H01L 23/3672 |
| | | | | 257/E23.102 |
| 2005/0094366 | A1* | 5/2005 | Lewis | G06F 1/187 |
| 2006/0250772 | A1* | 11/2006 | Salmonson | G06F 1/20 |
| | | | | 361/698 |
| 2007/0184269 | A1* | 8/2007 | Kiyokawa | H01L 23/295 |
| | | | | 257/E23.002 |
| 2007/0217146 | A1* | 9/2007 | Bozecki | H05K 5/0056 |
| 2014/0332182 | A1* | 11/2014 | Taras | H01L 23/44 |
| | | | | 165/80.3 |
| 2015/0245533 | A1* | 8/2015 | Wright | H05K 1/0254 |
| | | | | 361/679.31 |
| 2019/0063707 | A1* | 2/2019 | Paugam | H01R 13/60 |
| 2019/0120455 | A1* | 4/2019 | Badia | F21S 45/47 |
| 2020/0174534 | A1* | 6/2020 | Ganta Papa Rao Bala | |
| | | | | G06F 1/181 |
| 2021/0298203 | A1* | 9/2021 | Chung | H05K 7/20854 |
| 2022/0377929 | A1* | 11/2022 | Hidaka | H05K 7/20409 |
| 2023/0022850 | A1* | 1/2023 | Bassett | H05K 5/04 |
| 2024/0011130 | A1* | 1/2024 | Fan | B22D 21/04 |

* cited by examiner

DIE-CAST FIN WITH OPENING AND COVER

CROSS-REFERENCE TO RELATED APPLICATIONS

This application claims priority from and benefit of U.S. Provisional Patent Application Ser. No. 63/264,282, filed on Nov. 18, 2021, titled "Design Of The Mechanism To Achieve Memory Module Expandability In Telecom System," which is hereby incorporated by reference herein in its entirety.

FIELD OF THE INVENTION

The present invention relates generally to a die-cast fin, and more specifically, to a die-cast fin with an opening and a cover.

BACKGROUND OF THE INVENTION

Telecommunication devices 100, such as 5G equipment, base stations for cellular networks and servers, typically have compartments for holding various components such as a Printed Circuit Board Assembly (PCBA) 120, a memory module 130, an on-board chip 140, and a thermal pad 150, as shown in FIGS. 1B-1D. Since telecommunication devices are generally set up in the outdoor environment, the components are protected from adverse environmental conditions and unauthorized access by a die-cast fin 110 (heat sink, shown in FIG. 1A) covering the compartments, as shown in FIGS. 1C and 1D. Referring to FIGS. 1A-1D, generally, the die-cast fin 110 that transfers heat directly from the source, such as the on-board chip 140, is fixed to the compartments by fasteners such as screws 160 to enclose the components and protect them from external elements. In such configuration, the thermal pad 150 is placed between the on-board chip 140 and the die-cast fin 110 to cool down the heat generated from the on-board chip. When the die-cast fin 110 is uncoupled from the PCBA 120 and the compartments to replace the memory module 130 mounted on the PCBA, for example a Dual In-line Memory Module (DIMM), not only the DIMM, but also all other components including the thermal pad 150 are exposed. Other components on the PCBA may impede access to the DIMM 130 when the die-cast fin 110 is uncoupled from the PCBA 120. For example, the thermal pad 150 may be adversely affected or damaged when the die-cast fin 110 is open to expand or replace the DIMM 130, making expansion/replacement of DIMM difficult.

Therefore, a need exists for an improved die-cast fin that allows easy/direct access to DIMMs without affecting other components. The present disclosure is directed to such a die-cast fin that provides easy access to DIMMs for expansion, modification, or replacement of the same.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, a die-cast cooling device for protecting a computer assembly is disclosed. The die-cast cooling device includes a cooling plate, a plurality of die-cast fins, an opening formed on the cooling plate, and a cover coupled to the cooling plate. The cooling plate extends between two side walls, and the cooling plate and the side walls are arranged to form a protective space for computing components. The plurality of die-cast fins are formed on the cooling plate, extending away from the protective space. The opening provides access to the protective space. The cover is movable between a closed position and an open position, the cover preventing access to the protective space in the closed position, and the cover providing access to the protective space in the open position.

In some examples, the cover is pivotably coupled to the cooling plate. In some exaples, the cover has parallel sides and a cover wall extends from each side of the cover such that the cover walls face each other. In some examples, a protrusion is formed outwardly from each cover wall, and the opening has corresponding receiving portions configured to receive the protrusions. The cover walls are inserted into the opening in the closed position such that the opening is sealed by the cover. A top surface of the cover is aligned with a top surface of the plurality of die-cast fins in the closed position.

In some examples, the die-cast cooling device further includes a fastener inserted through a through-hole of the cover. Further, the plurality of die-cast fins include a receiving portion, the fastener being received by the receiving portion to directly couple the cover to the cooling plate. A portion of the cover is recessed with respect to a top surface of the cover such that a top of the fastener is positioned lower than the top surface of the cover when the fastener is received at the receiving portion. Further, the receiving portion is recessed with respect to a top surface of the plurality of die-cast fins such that the top of the fastener is positioned lower than the top surface of the plurality of die-cast fins when the fastener is received at the receiving portion. The portion of the cover protrudes from an edge of the cover, and one side of the opening corresponding to the edge of the cover is recessed to receive the protruded portion of the cover.

In some examples, the plurality of die-cast fins and the cover are made of different materials. For example, the cover is made of a synthetic polymer including plastics.

According to certain aspects of the present disclosure, a frame for enclosing computing components includes a plurality of fins arranged in parallel, an opening, and a cover movable between a closed position and an open position to close or open the opening. In some examples, the plurality of fins comprise fins of different lengths. In some examples, the frame further includes a fastener passing through a through-hole of the cover and received by a receiving portion of the frame such that the cover is directly coupled to the frame by the fastener.

According to certain aspects of the present disclosure, a computing device includes a Printed Circuit Board Assembly (PCBA) on which a plurality of computing components are mounted, a memory module mounted on the PCBA, and a die-cast fin covering the PCBA. The die-cast fin has a cover movable between an open position and a closed position. The cover covers an opening in the closed position. The memory module is accessible when the cover is in the open position.

In some examples, the cover is pivotably coupled to the die-cast fin. The plurality of computing components are not exposed while the memory module is exposed when the cover is in the open position. In some examples, the cover includes protrusions. The opening has corresponding receiving portions configured to receive the protrusions. The cover is configured to pivot about an axis of the protrusions.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

Figure 1A:
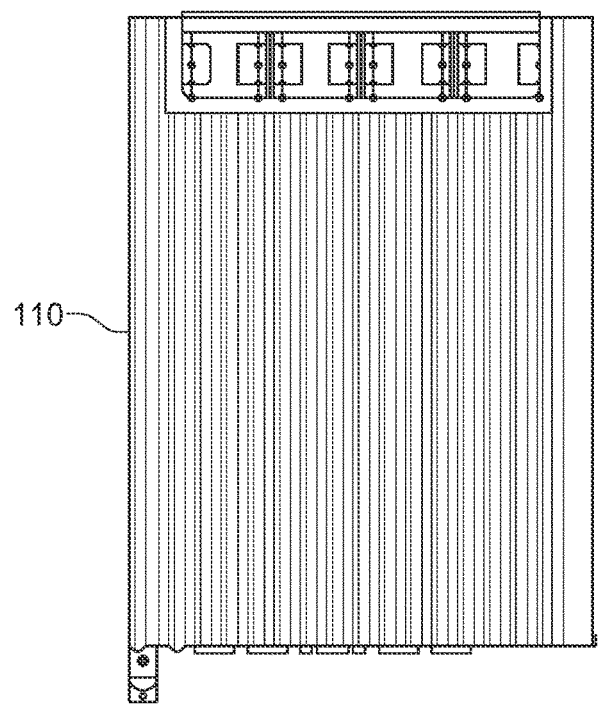
FIG. 1A is a front view of a prior art die-cast fin.
Figure 1B:
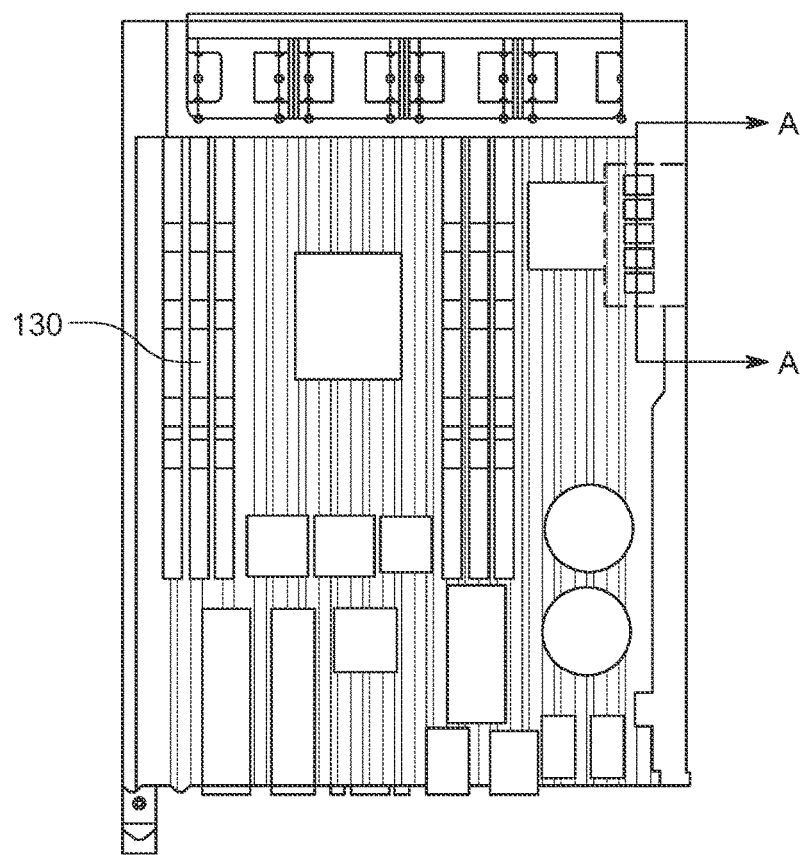
FIG. 1B is a front view of compartments of a device with the die-cast fin shown in FIG. 1A removed.
Figure 1C:
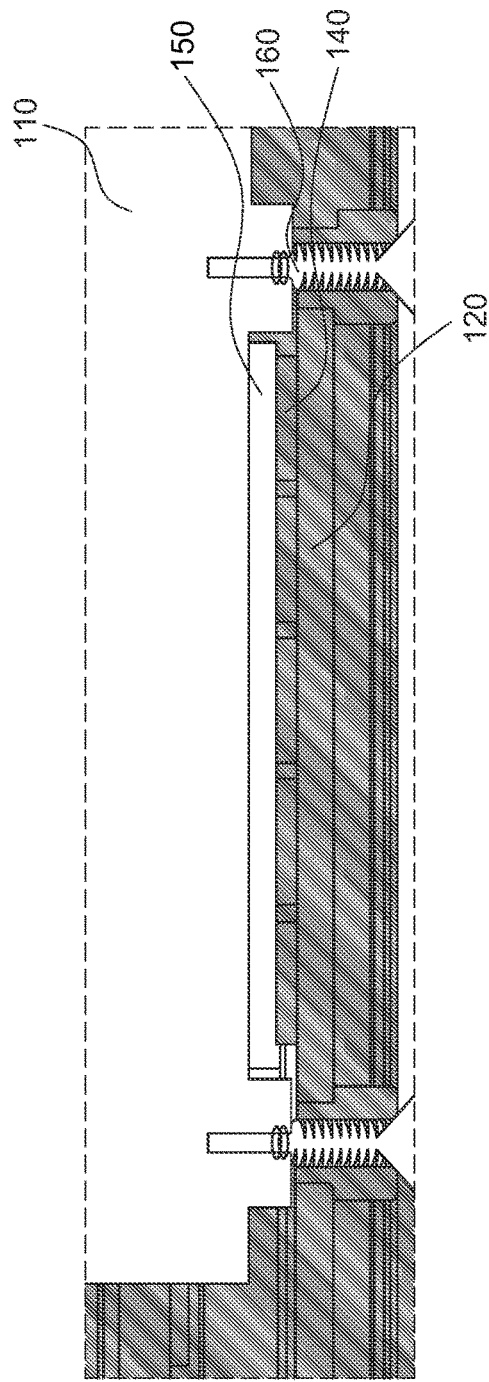
FIG. 1C is a cross-sectional view taken generally across line A-A shown in FIG. 1B.
Figure 1D:
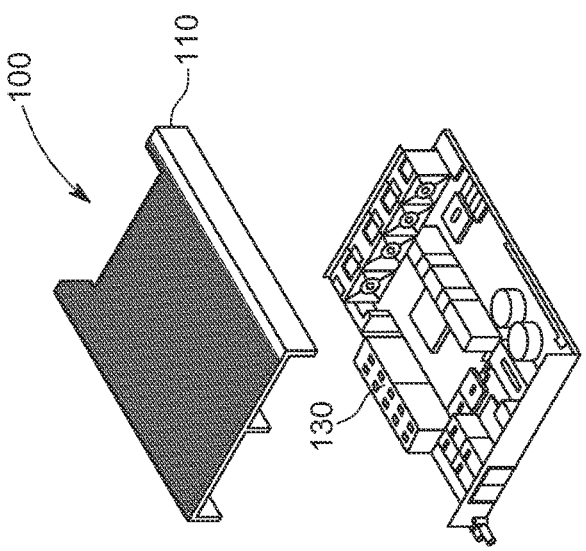
FIG. 1D is a generally perspective view of a device with a prior art die-cast fin.

While the present disclosure is susceptible to various modifications and alternative forms, specific implementations have been shown by way of example in the drawings and will be described in further detail herein. It should be understood, however, that the present disclosure is not intended to be limited to the particular forms disclosed. Rather, the present disclosure is to cover all modifications, equivalents, and alternatives falling within the spirit and scope of the present disclosure as defined by the appended claims.

DETAILED DESCRIPTION

The present disclosure relates to a die-cast fin with an opening and a cover. The cover can be easily open to allow easy access to components that lie underneath the die-cast fin. Thus, the die-cast fin does not need to be detached from a device when it is necessary to access the components of the device.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

Figure 2:
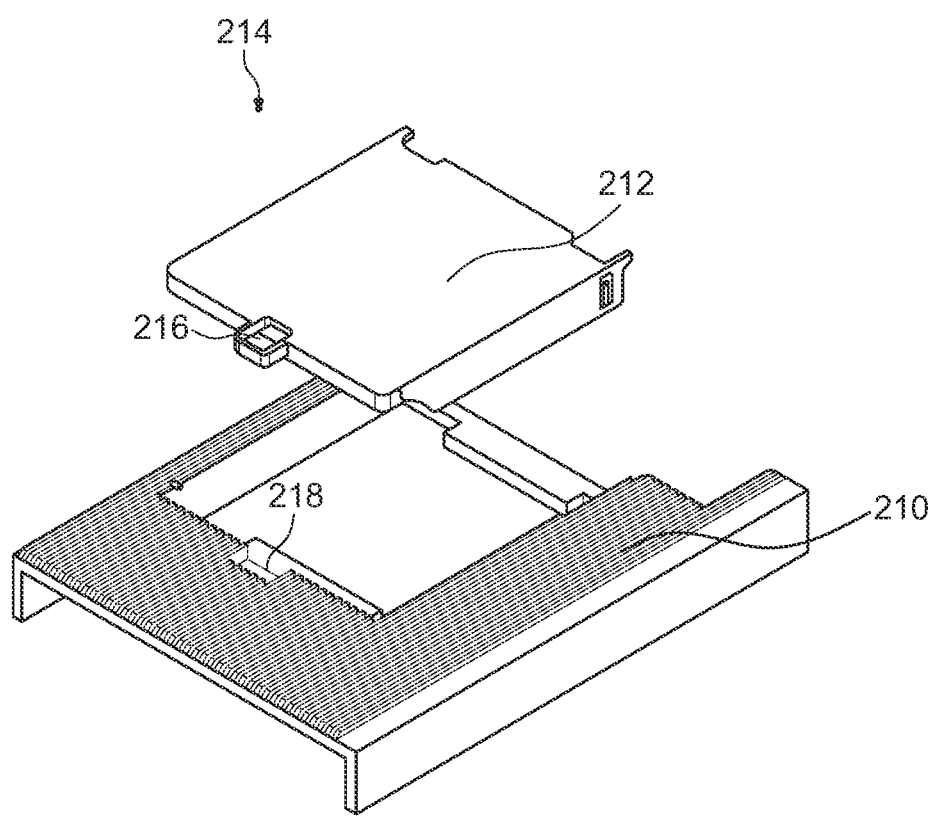
FIG. 2 is a generally perspective view of a die-cast fin with an opening and a detached cover, according to certain aspects of the present disclosure.

Referring to FIG. 2, a die-cast fin or cooling device 210 ("die-cast fin" hereinafter), according to an embodiment of the present disclosure, has an opening that can be closed or open by a cover 212. In general, the die-cast fin 210 has a cooling plate and a plurality of fins formed on the cooling plate to form a protective space for computing components. In an embodiment, the cover 212 is coupled the cooling plate. In FIG. 2, the cover 212 is detached from the die-cast fin 210 for clarity.

Referring to FIG. 2, according to various embodiments of the present disclosure, the opening is formed at a portion of the die-cast fin 210, such that lengths of some of the fins are shortened by the opening, compared to lengths of fins that are not interrupted by the opening. In one embodiment, shorter fins are formed at a first side of the opening of the die-cast fin 210, the shorter fins extending perpendicular to the first side. In further embodiments, the longer fins are formed at or near a second side of the opening of the die-cast fin 210, the second side being perpendicular to the first side and the longer fins extending along the second side. In further embodiments, no fins are formed at a third side of the opening of the die-cast fin 210 that is in parallel with the first side. In yet further embodiments, no fins or fewer fins are formed at a fourth side of the opening of the die-cast fin 210 that is in parallel with the second side compared to the number of the longer fins formed near the second side.

In one embodiment, the cover 212 coupled to the die-cast fin 210 is locked or unlocked by coupling means or a fastener, such as a pin or screw 214, passing through a through-hole 216 of the cover 212 and inserted into a receiving portion 218 formed at a portion of the die-cast fin. The receiving portion 218 may be a receptacle or through-hole. Coupling of the cover 212 to the die-cast fin 210 will be discussed referring to FIG. 3.

According to various embodiments of the present disclosure, the through-hole 216 is formed at a portion protruding from a side of the cover 212, as shown in FIGS. 2-5C. In one embodiment, the protruding portion is recessed with respect to the top surface of the cover 212. In one embodiment, the recessed protruding portion of the cover 212 is surrounded by walls. In one embodiment, a gap is formed between one of the walls and the protruding portion of the cover 212 such that a portion of the die-cast fin 210 is visible through the gap when the cover 212 is closed. In one embodiment, the top of the pin or screw 214 inserted into the receiving portion 218 of the die-cast fin 210 is positioned lower than the top surface of the cover 212 in a closed configuration.

According to various embodiments of the present disclosure, the die-cast fin 210 has a recessed portion at one side of the opening. The recessed portion of the die-cast fin 210 is sized and shaped to receive the recessed protruding portion of the cover 212. According to one embodiment, fins formed between an edge and a first side of the recessed portion of the die-cast fin 210 are even shorter than the shorter fins such that the even shorter fins are located between a number of the shorter fins at one side thereof and a number of the shorter fins at another side thereof. See FIGS. 2-5C.

Generally, the die-cast fin 210 is made of zinc, aluminum, or zinc-aluminum alloy. However, the materials used to cast the fin 210 are not limited to zinc, aluminum, or zinc-aluminum alloy, and may be made of any materials that are suitable for die casting. Although the cover 212 may be made of the same material as the die-cast fin 210, preferably, the cover is made of a different material that is weather/heat/water-resistant. For example, the cover 212 is made of polymers such as plastics that can be easily and inexpensively shaped into a desired shape. However, the material for the cover 212 is not limited to plastics, and the cover may be made of any materials that are easily and inexpensively formed into the shape of the cover.

According to various embodiments of the present disclosure, the cover 212 has parallel walls that face each other, as shown in FIGS. 2, 3, 4B, 5A, and 5C. Each wall extends vertically from a corresponding edge of the cover 212 such that the walls are perpendicular to the top surface of the cover. The walls of the cover 212 are inserted into the opening of the die-cast fin 210 when the cover is closed. In one embodiment, heights of the two parallel walls are the same.

Referring to FIGS. 4A-5C, the width of the opening of the die-cast fin 210 is sized such that no space or very little space is formed between the walls of the cover 212 and their corresponding sides of the opening of the die-cast fin when the cover is closed. Thus, sealing is achieved when the cover 212 is closed such that components underneath the die-cast fin 210 are protected from the outer environment. According to various embodiments of the present disclosure, the cover 212 has an additional wall extending vertically from another edge of the cover such that the additional wall is perpendicular to the two parallel walls. In one embodiment, the heights of the additional wall and the two parallel walls are the same. In another embodiment, the height of the additional wall is less than the heights of the two parallel walls.

Figure 3:
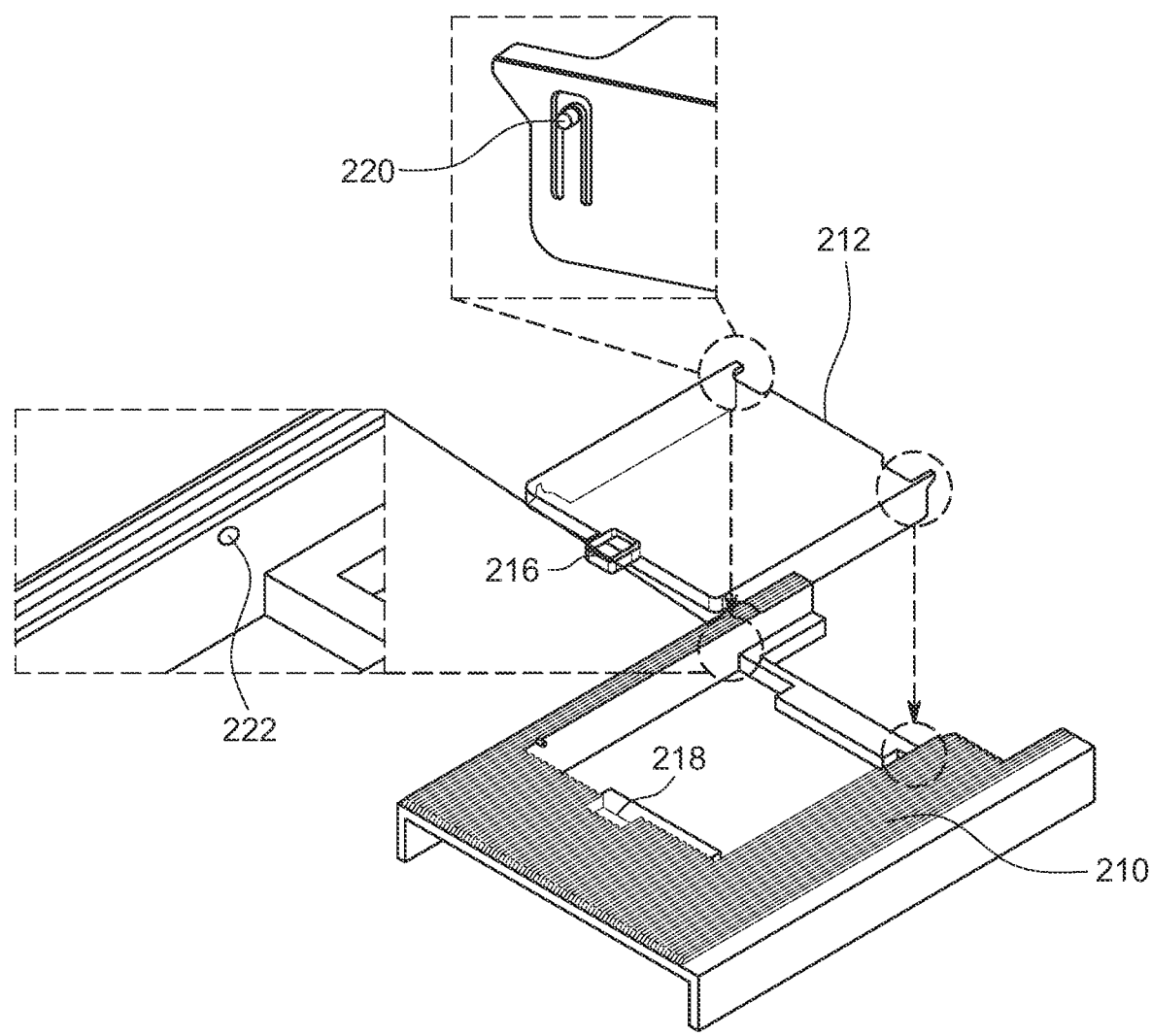
FIG. 3 is an exploded view of the die-cast fin of FIG. 2 showing a coupling mechanism between the die-cast fin and the cover, according to certain aspects of the present disclosure.

Various coupling mechanisms may be employed to couple the cover 212 to the die-cast fin 210. Referring to FIG. 3, for example, the cover 212 has protrusions 220 formed at two opposite sides thereof near an edge of the cover. However, the positions of the protrusions 220 are not limited thereto, and the protrusions may be formed at different positions of the cover 212, for example, near the other edge or a middle portion of the cover. The die-cast fin 210 has receiving portions 222 formed near the opening or at inner walls of the opening and shaped to receive the protrusions 220. Positions of the receiving portions 222 are determined according to the positions of the corresponding protrusions 220. In one embodiment, the protrusions 220 of the cover 212 are inserted into the corresponding receiving portions 222 of the die-cast fin 210. Various hinge mechanisms may be employed for coupling of the cover 212 and the die-cast fin 210 instead of the set of the protrusions 220 and the receiving portions 222 described above. Preferably, the cover 212 is not completely detached from the die-cast fin 210 even when the cover is in the open configuration. For example, protrusions may be formed on the die-cast fin 210. Further, receiving portions or through-holes receiving the protrusions may be formed at the cover 212.

In an alternative embodiment, the cover 212 is completely detached from the die-cast fin 210 when the cover is in the open configuration. For example, the cover 212 has at least one handle such that the cover can be open by pulling the handle away from the die-cast fin 210.

Figure 4B:
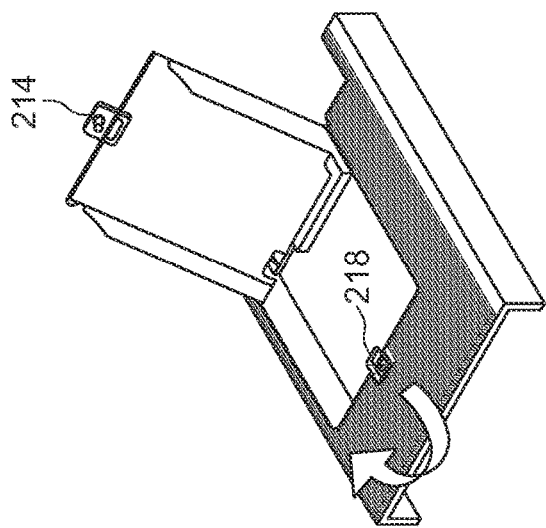
FIGS. 4A-4C are generally perspective views of a die-cast fin in open and closed configurations, according to certain aspects of the present disclosure.
Figure 4C:
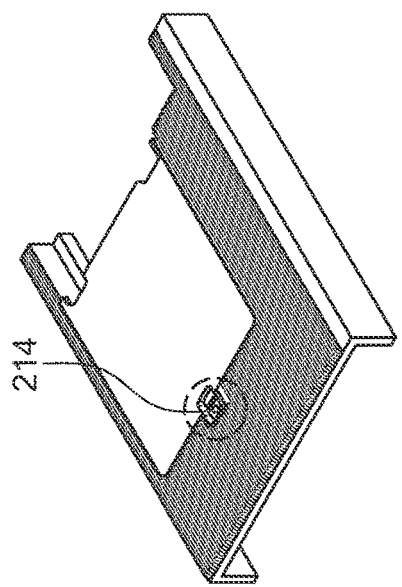
Figure 4A:
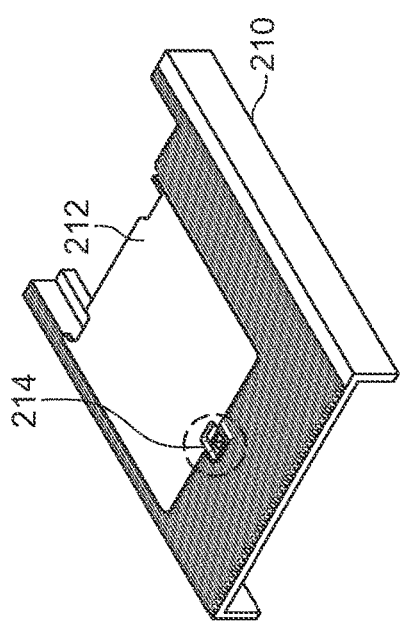

Referring to FIG. 4A, when the cover 212 is in a closed position, the cover is directly coupled to the die-cast fin 210 or locked by a locking mechanism. In one embodiment, a through-hole 216 (shown in FIG. 3) is formed at a portion of the cover 212. Further, a pin or screw 214 passing through the through-hole 216 is received by a receiving portion 218 formed at a portion of the die-cast fin 210. Alternatively, instead of employing the pin or screw 214, a protrusion may be formed at a portion of the cover 212 without requiring the through-hole 216. The protrusion may be directly inserted into the receiving portion 218 of the die-cast fin 210 when the cover 212 is in the closed configuration.

Referring to FIG. 4B, to open the cover 212, the cover may be raised by being rotated about an axis of the protrusions 220 and receiving portions 222. In case the cover 212 is locked by the pin or screw 214, the pin or screw needs to be unscrewed from the receiving portion 218 before being raised, as shown in FIG. 4A. In one embodiment, once the cover 212 is unlocked, the pin or screw 214 may remain in the through-hole 216 of the cover even when the cover is raised and open, as shown in FIG. 4B.

Referring to FIG. 4C, the cover 212 is closed by being rotated downward about the axis of the two protrusions 220 and their corresponding receiving portions 222. Once the cover 212 is closed, it may be locked by inserting or rotating the pin or screw 214 to/in the receiving portion 218.

Figure 5C:
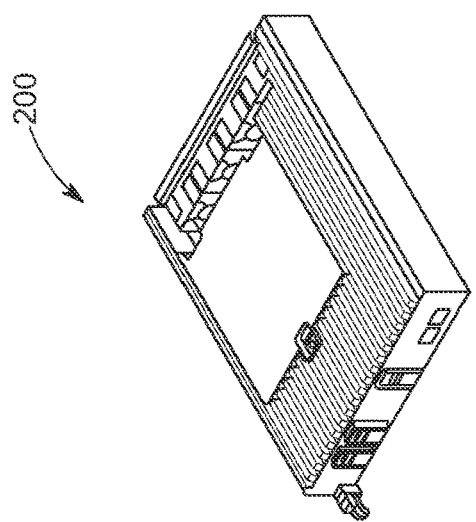
FIGS. 5A-5C are generally perspective views of a device having a DIMM and a die-cast fin with a cover in open and closed configurations, according to certain aspects of the present disclosure.
Figure 5B:
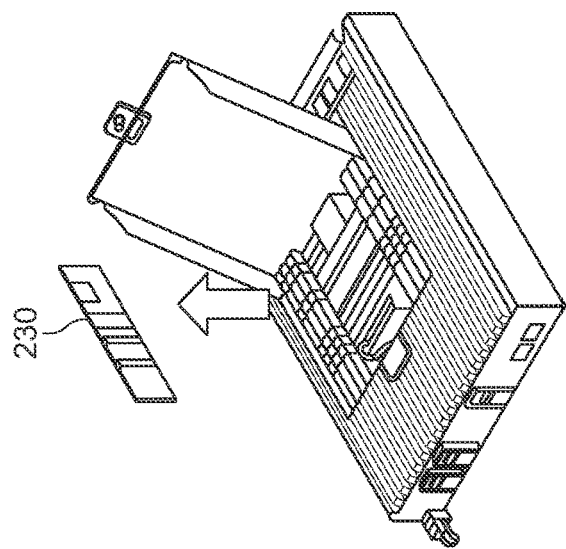
Figure 5A:
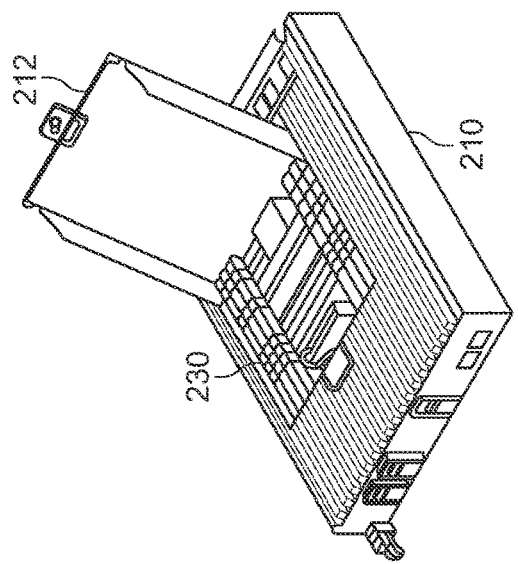

Referring to FIG. 5A, in order to replace or expand a memory module 230 of a computing or telecommunication device 200, the memory module 230 mounted on a PCBA can be accessed through the opening of the die-cast fin 210.

This can be achieved by opening the cover 212 without removing the entire die-cast fin 210 from the device 200. Therefore, referring to FIG. 5B, the memory module 230 can be replaced or expanded without damaging other components of the computing or telecommunication device 200. Referring to FIG. 5C, once the memory module 230 is replaced, modified, or expanded, the cover 212 is closed, thus avoiding the possibility of damaging other components when detaching the entire die-cast fin 210 from the computing or telecommunication device 200.

While various embodiments of the present disclosure have been described above, it should be understood that they have been presented by way of example only, and not limitation. Numerous changes to the disclosed examples can be made in accordance with the disclosure herein without departing from the spirit or scope of the disclosure. Thus, the breadth and scope of the present disclosure should not be limited by any of the above described examples. Rather, the scope of the disclosure should be defined in accordance with the following claims and their equivalents.

One or more elements or aspects or steps, or any portion(s) thereof, from one or more of any of claims below can be combined with one or more elements or aspects or steps, or any portion(s) thereof, from one or more of any of the other claims or combinations thereof, to form one or more additional implementations and/or claims of the present disclosure.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular examples only and is not intended to be limiting of the disclosure. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this disclosure belongs. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. A die-cast cooling device for protecting a computer assembly, the die-cast cooling device comprising:
   a cooling plate extending between two side walls, the cooling plate and the two side walls being arranged to form a protective space for computing components;
   a plurality of die-cast fins formed on the cooling plate and extending away from the protective space;
   an opening formed on the cooling plate for providing access to the protective space; and
   a cover coupled to the cooling plate and being movable between a closed position and an open position, the cover preventing access to the protective space in the closed position, the cover providing access to the protective space in the open position,
   wherein the plurality of die-cast fins include a receiving portion that is recessed with respect to a top surface of the plurality of die-cast fins such that a top of a fastener is positioned lower than the top surface of the plurality of die-cast fins when the fastener is received at the receiving portion.

2. The die-cast cooling device of claim 1, wherein the cover is pivotably coupled to the cooling plate.

3. The die-cast cooling device of claim 1, wherein the cover has parallel sides and a cover wall extends from each side of the parallel sides of the cover such that the cover walls face each other.

4. The die-cast cooling device of claim 3, wherein a protrusion is formed outwardly from each cover wall, and the cooling plate has corresponding receiving portions configured to receive the protrusions.

5. The die-cast cooling device of claim 3, wherein the cover walls are inserted into the opening in the closed position such that the opening is sealed by the cover.

6. The die-cast cooling device of claim 5, wherein a top surface of the cover is aligned with a top surface of the plurality of die-cast fins in the closed position.

7. The die-cast cooling device of claim 1, wherein the fastener is inserted through a through-hole of the cover.

8. The die-cast cooling device of claim 1, wherein no fins are formed on the cover.

9. The die-cast cooling device of claim 1, wherein a portion of the cover is recessed with respect to a top surface of the cover such that the top of the fastener is positioned lower than the top surface of the cover when the fastener is received at the receiving portion.

10. The die-cast cooling device of claim 9, wherein the portion of the cover protrudes from an edge of the cover, and one side of the opening corresponding to the edge of the cover is recessed to receive the protruded portion of the cover.

11. The die-cast cooling device of claim 1, wherein the plurality of die-cast fins are made of a first material and the cover is made of a second material that is different from the first material.

12. The die-cast cooling device of claim 11, wherein the first material comprises zinc, aluminum, or zinc-aluminum alloy.

13. The die-cast cooling device of claim 12, wherein the second material comprises a synthetic polymer including plastics.

14. A frame for enclosing computing components, the frame comprising:
   a plurality of fins arranged in parallel;
   an opening; and
   a cover movable between a closed position and an open position to close or open the opening,
   wherein no fins are formed on the cover,
   wherein the plurality of fins are made of a first material and the cover is made of a second material that is different from the first material,
   wherein the first material comprises zinc, aluminum, or zinc-aluminum alloy, and
   wherein the second material comprises a synthetic polymer including plastics,
   wherein the plurality of fins include a receiving portion that is recessed with respect to a top surface of the plurality of fins such that a top of a fastener is positioned lower than the top surface of the plurality of fins when the fastener is received at the receiving portion.

15. The frame of claim 14, wherein the plurality of fins comprise fins of different lengths.

16. The frame of claim 14, further comprising a fastener passing through a through-hole of the cover and received by a receiving portion of the frame such that the cover is directly coupled to the frame by the fastener.

17. A computing device comprising:
a Printed Circuit Board Assembly (PCBA) on which a plurality of computing components are mounted;
a memory module mounted on the PCBA;
a die-cast fin covering the PCBA, the die-cast fin having a cover movable between an open position and a closed position, the cover covering an opening in the closed position, the memory module being accessible when the cover is in the open position; and
a fastener passing through a through-hole of the cover and received by a receiving portion of the die-cast fin, wherein:
the receiving portion is recessed with respect to a top surface of the die-cast fin such that a top of the fastener is positioned lower than the top surface of the die-cast fin when the fastener is received at the receiving portion;
the cover comprises a pair of protrusions;
the die-cast fin has a pair of corresponding receiving portions configured to receive the pair of protrusions; and
the cover is configured to pivot about an axis of the pair of protrusions.

18. The computing device of claim 17, wherein the plurality of computing components are not exposed while the memory module is exposed when the cover is in the open position.

19. The computing device of claim 17, wherein the die-cast fin is made of a first material and the cover is made of a second material that is different from the first material.

* * * * *